United States Patent
Liu

(10) Patent No.: US 11,563,051 B2
(45) Date of Patent: Jan. 24, 2023

(54) LIGHT-EMITTING DIODE (LED) LIGHT BOARD, SPLICED LED LIGHT BOARD AND DISPLAY DEVICE HAVING THE ENDS OF THE FIRST AND SECOND SIGNAL WIRES BEING STAGGERED

(71) Applicant: WUHAN CHINA STAR OPTOELECTRONICS TECHNOLOGY CO., LTD., Hubei (CN)

(72) Inventor: Fancheng Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 191 days.

(21) Appl. No.: 16/981,351

(22) PCT Filed: Aug. 17, 2020

(86) PCT No.: PCT/CN2020/109614
§ 371 (c)(1),
(2) Date: Sep. 16, 2020

(87) PCT Pub. No.: WO2022/027726
PCT Pub. Date: Feb. 10, 2022

(65) Prior Publication Data
US 2022/0045120 A1 Feb. 10, 2022

(30) Foreign Application Priority Data
Aug. 5, 2020 (CN) .......................... 202010776988.6

(51) Int. Cl.
*H01L 27/15* (2006.01)
*H01L 33/48* (2010.01)
(Continued)

(52) U.S. Cl.
CPC ............. *H01L 27/156* (2013.01); *G09G 3/32* (2013.01); *H01L 33/486* (2013.01); *H01L 33/62* (2013.01)

(58) Field of Classification Search
CPC ....... G09G 3/32; H01L 27/156; H01L 33/486; H01L 33/62
See application file for complete search history.

(56) References Cited

U.S. PATENT DOCUMENTS

2015/0161928 A1  6/2015  Kim
2021/0217353 A1*  7/2021  Zhao ................... H01L 25/0753

FOREIGN PATENT DOCUMENTS

CN  201866691 U  6/2011
CN  109521603 A  3/2019
(Continued)

*Primary Examiner* — Anh D Mai
(74) *Attorney, Agent, or Firm* — PV IP PC; We Te Chung; Ude Lu

(57) ABSTRACT

The present application provides a light-emitting diode (LED) light board, a spliced LED light board and a display device. The LED light board includes a substrate, a plurality of LED chips, and a gate driving module; the LED chip array is arranged on the substrate; the gate driving module is disposed on the substrate and configured to provide a gate driving signal to the LED chips, the gate driving module includes a plurality of gate driving units; the LED chips are arranged on opposite sides of the gate driving module, and each of the gate driving units is electrically connected to its corresponding ones of the LED chips on opposite sides of the gate driving unit.

10 Claims, 6 Drawing Sheets

(51) Int. Cl.
*H01L 33/62* (2010.01)
*G09G 3/32* (2016.01)

(56) References Cited

FOREIGN PATENT DOCUMENTS

CN 110930953 A 3/2020
CN 111402754 A 7/2020

* cited by examiner

LIGHT-EMITTING DIODE (LED) LIGHT BOARD, SPLICED LED LIGHT BOARD AND DISPLAY DEVICE HAVING THE ENDS OF THE FIRST AND SECOND SIGNAL WIRES BEING STAGGERED

BACKGROUND OF INVENTION

Field of Invention

The present application relates to a field of display technology, and in particular to a light-emitting diode (LED) light board, a spliced LED light board and a display device.

Description of Prior Art

A mini light-emitting diode (mini-LED) backlight modules has attracted more and more attention due to its high brightness, ultra-narrow bezel, notch, and an ability to achieve partial partition design. Generally, a higher number of the partitions generally means a better display effect, but the existing method of driving the mini-LEDs is generally passive driving. When more partitions are realized, more driving chips are usually required, which will result in a significant increase in cost, and is not conducive to narrow bezel and integrated display.

Therefore, major manufacturers are developing active driving mini-LEDs, that is, driving mini-LEDs by designing driving elements on a glass substrate, using thin-film transistors to achieve active driving, thereby greatly reducing a number of the driving chips and driving cost to achieve more partitions and better display effects.

However, since medium and large-sized mini-LED backplanes are usually formed by splicing, a design of the current active driving structure of the mini-LED cannot meet requirements for arbitrary splicing. Therefore, how to realize the arbitrary splicing of mini-LED backplanes has become an urgent technical problem to be solved.

SUMMARY OF INVENTION

The present application provides a light-emitting diode (LED) light board, a splicing LED light board, and a display device to solve the technical problem that the current active mini-LED drive structure design cannot meet the requirements of arbitrary splicing.

The present application provides a light-emitting diode (LED) light board, including:

a substrate;

a plurality of LED chips disposed in an array on the substrate; and a gate driving module disposed on the substrate and configured to provide a gate driving signal to the LED chips, wherein the gate driving module includes a plurality of gate driving units, the LED chips are arranged on opposite sides of the gate driving module, and each of the gate driving units is electrically connected to its corresponding ones of the LED chips on opposite sides of the gate driving unit.

In the LED light board according to the present application, the plurality of gate driving units and the plurality of LED chips are arranged in an array;

the plurality of gate driving units are arranged in a column; and each of the gate driving units is electrically connected to the LED chips arranged on opposite sides of the gate driving unit which are in a same row as corresponding one of the gate driving units.

In the LED light board according to the present application, a number of the LED chips arranged on and electrically connected to one side of each of the gate driving units is same as a number of the LED chips arranged on and electrically connected to an opposite side of each of the gate driving units.

In the LED light board according to the present application, the plurality of LED chips include a plurality of first LED chips and a plurality of second LED chips arranged in parallel, the first LED chips are arranged on one side of the gate driving module, and the second LED chips are arranged on an opposite side of the gate driving module;

the plurality of gate driving units includes first gate driving units and second gate driving units arranged in parallel, the first gate driving units are arranged at a side of the gate driving module close to the first LED chips, and the second gate driving units are arranged on a side of the gate driving module close to the second LED chips; and each of the first gate driving units is electrically connected to the first LED chips arranged in a same column as corresponding one of first gate driving units, and each of the second gate driving units is electrically connected to the second LED chips arranged in a same column as corresponding one of the second gate driving units.

In the LED light board according to the present application, the first gate driving units and the second gate driving units are arranged adjacent to each other, and a number of the first LED chips is same as a number of the second LED chips.

In the LED light board according to the present application, the LED light board further includes a plurality of first signal wires and a plurality of second signal wires, which are arranged at a same level as each other and at a same level as some of layers of the gate driving units; and in each column, one of the gate driving units, the LED chips, and one of the first signal wires and one of the second signal wires connecting the gate driving unit to the LED chips form one of display modules; and in each of the display modules, each of the gate driving units is connected to the LED chips located on one side thereof through one of the first signal wires, and each of the gate driving units is connected to the LED chips located on an opposite side thereof through one of the second signal wires.

In the LED light board according to the present application, in each of the display modules, extending directions of each of the first signal wires and each of the second signal wires coincide with each other.

In the LED light board according to the present application, in each of the display modules, the first signal wires and the second signal wires are staggered with each other.

The present application provides a spliced LED light board, including at least two LED light boards spliced and arranged side by side, wherein each of the LED light boards includes:

a substrate;

a plurality of LED chips disposed in an array on the substrate; and a gate driving module disposed on the substrate and configured to provide a gate driving signal to the LED chips, wherein the gate driving module includes a plurality of gate driving units, the LED chips are arranged on opposite sides of the gate driving module, and each of the gate driving units is electrically connected to its correspondingly ones of the LED chips on opposite sides of the gate driving unit; and a plurality of first signal wires and a plurality of second signal wires, which are arranged at a same level as each other and at a same level as some of layers of the gate driving units, wherein in each column, one of the gate driving units, the LED chips, and one of the first signal wires and one of the second signal wires connecting the gate driving unit to the LED chips form one of display modules, wherein, in each of the display modules, each of the gate driving units is connected to the LED chips located on one side thereof through one of the first signal wires, and each of the gate driving units is connected to the LED chips located on an opposite side thereof through one of the second signal wires; and wherein ends of the first signal wires and the ends of the second signal wires are staggered with each other.

In the spliced LED light board according to the present application, the spliced LED light board includes a display area and border areas arranged at opposite sides of the display area, wherein the plurality of LED chips are arranged in the display area;

wherein each of the first signal wires includes a first part and a second part connected to the first part, and the first part is located in the display area, and the second part is located in the border area;

wherein, in each of the display modules, an orthographic projection of the first part on a plane where the substrate is located penetrates an orthographic projection of the LED chips on the plane where the substrate is located; and wherein, the second part includes a first horizontal section, a vertical section, and a second horizontal section that are sequentially connected, the first horizontal section is connected to the first part, and in a row direction of the LED chips, the second horizontal section is located outside the LED chips.

In the spliced LED light board according to the present application, in a column direction of the LED chips, the first signal wires are arranged outside the LED chips.

In the spliced LED light board according to the present application, each of the LED light boards further includes a plurality of first connection wires, the first connection wires are electrically connected to the LED chips in a one-to-one correspondence, and the first signal wires are electrically connected to the LED chips through the first connection wires; and wherein the first connection wires and the first signal wires are arranged at different levels.

In the spliced LED light board according to the present application, in the column direction of the LED chips, the second signal wires are located outside the LED chips and located at a side different from the first signal wires; and wherein each of the LED light boards further includes a plurality of second connection wires, the second connection wires are electrically connected to the LED chips in a one-to-one correspondence, and the second signal wires are electrically connected to the LED chips through the second connection wires.

In the spliced LED light board according to the present application, in the row direction of the LED chips, a line width of each of the first signal wires and a line width of each of the second signal wires are both smaller than one half of a distance between adjacent ones of the LED chips.

In the spliced LED light board according to the present application, the first signal wires and the second signal wires are both high-level signal wires or low-level signal wires.

The present application also provides a display device, including a liquid crystal display panel and a backlight module, wherein the backlight module includes a light-emitting diode (LED) light board, and the LED light board includes:

a substrate;

a plurality of LED chips disposed in an array on the substrate; and a gate driving module disposed on the substrate and configured to provide a gate driving signal to the LED chips, wherein the gate driving module includes a plurality of gate driving units, the LED chips are arranged on opposite sides of the gate driving module, and each of the gate driving units is electrically connected to its corresponding ones of the LED chips on opposite sides of the gate driving unit.

In the display device according to the present application, the plurality of gate driving units and the plurality of LED chips are arranged in an array;

the plurality of gate driving units are arranged in a column; and each of the gate driving units is electrically connected to the LED chips arranged on opposite sides of the gate driving unit which are in a same row as corresponding one of the gate driving units.

In the display device according to the present application, a number of the LED chips arranged on and electrically connected to one side of each of the gate driving units is same as a number of the LED chips arranged on and electrically connected to an opposite side of each of the gate driving units.

In the display device according to the present application, the LED light board further includes further including a plurality of first signal wires and a plurality of second signal wires, which are arranged at a same level as each other and at a same level as some of layers of the gate driving units; and in each column, one of the gate driving units, the LED chips, and one of the first signal wires and one of the second signal wires connecting the gate driving unit to the LED chips form one of display modules; and in each of the display modules, each of the gate driving units is connected to the LED chips located on one side thereof through one of the first signal wires, and each of the gate driving units is connected to the LED chips located on an opposite side thereof through one of the second signal wires.

In the display device according to the present application, in each of the display modules, the first signal wires and the second signal wires are staggered with each other.

Compared with the LED light board in the prior art, the LED light board provided by the present application satisfies requirements of light boards of different sizes by providing a gate driving module on a substrate, wherein the gate driving module includes a plurality of gate driving units, the LED chips are arranged on opposite sides of the gate driving module, and each of the gate driving units is electrically connected to its corresponding ones of the LED chips on opposite sides of the gate driving unit, such that when cutting the LED light board, different sizes of light boards can be cut out, so as to meet the requirements of different sizes of LED lights. Splicing requirements of the board.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
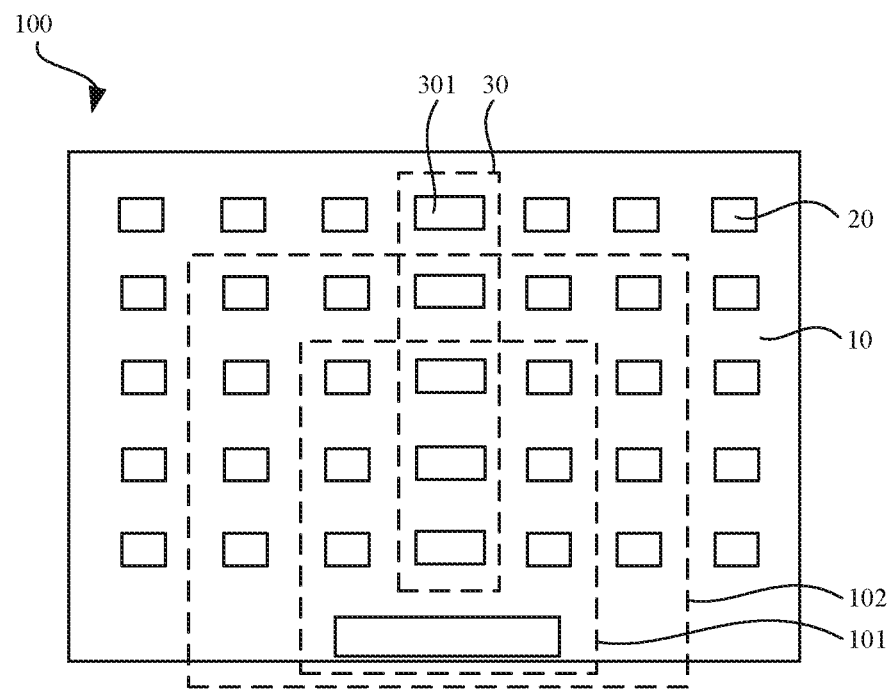
FIG. 1 is a first structural schematic diagram of an LED light board provided by the first embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

It should be noted that the number of LED chips in the LED light board of the present application is only for illustration, which is used to facilitate the description of the following embodiments of the present application, but it should not be understood as a limitation of the present application.

It should be noted that the LED light board in the present application also includes a driving module, which includes a driving chip, a timing controller (TCON) chip, etc. (not shown), and the driving module can be bound to the LED light board through a flexible circuit board or a printed circuit board, which will not be repeated herein for brevity.

Figure 2:
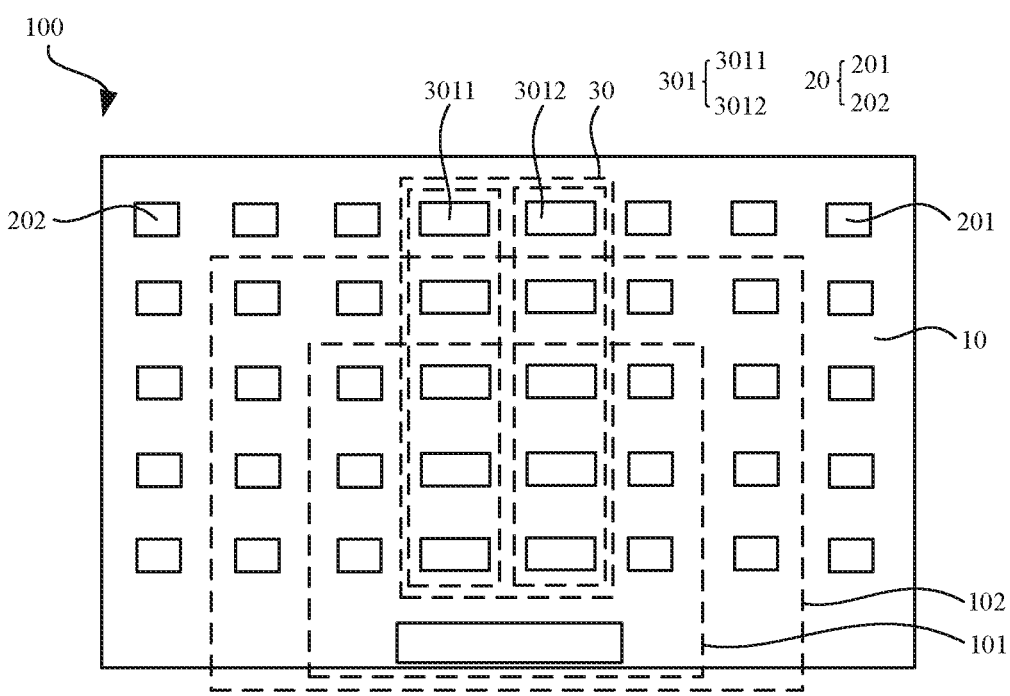
FIG. 2 is a second structural schematic diagram of the LED light board provided by the first embodiment of the present application.

Referring to FIG. 1 and FIG. 2, FIG. 1 is a first schematic diagram of the LED light board provided by the first embodiment of the present application; FIG. 2 is a second schematic diagram of the LED light board provided by the first embodiment of the present application.

The first embodiment of the present application provides a light-emitting diode (LED) light board 100, which includes a substrate 10, a plurality of LED chips 20, and a gate driving module 30. The array of LED chips 20 is arranged on the substrate 10. The gate driving module 30 is disposed on the substrate 10 and configured to provide a gate driving signal to the LED chips 20. The gate driving module 30 includes a plurality of gate driving units 301. The LED chips 20 are arranged on opposite sides of the gate driving module 30, and each of the gate driving units 301 is electrically connected to its correspondingly ones of the LED chips 20 on opposite sides of the gate driving units 301.

Therefore, in the LED light board 100 provided by the first embodiment of the present application, a gate driving module 30 is provided on the substrate 10. The gate driving module 30 includes a plurality of gate driving units 301, and the LED chips 20 are arranged on opposite sides of each of the gate driving module 30. Each of the gate driving units 301 is electrically connected to its corresponding ones of the LED chips 20 on opposite sides of the gate driving unit 301, such that when cutting the LED light board 100, different sizes of light boards can be cut out, so as to meet the requirements of different sizes of LED lights. Splicing requirements of the board.

It should be noted that the substrate 10 in the embodiment of the present application includes gate scan lines, data lines, thin-film transistors, and various insulating layers (not shown). The specific structure of the substrate 10 can refer to the prior art, and it will not be repeated herein for brevity.

In the first structure of the LED light board 100 provided by the first embodiment of the present application, as shown in FIG. 1, the plurality of gate driving units 301 and the plurality of LED chips 20 are arranged in an array; the plurality of gate driving units 301 are arranged in a column; and each of the gate driving units 301 is electrically connected to the LED chips 20 arranged on opposite sides of the gate driving unit 301 which are in a same row as corresponding one of the gate driving units 301.

Further, a number of the LED chips 20 arranged on one side of each of the gate driving units 301 is same as a number of the LED chips 20 arranged on an opposite side of each of the gate driving units 301.

It is understandable that in the cutting process of the LED light board, an edge of the LED light board is usually taken as a starting point for cutting, and the cutting is carried out toward a center of the LED light board according to the size required by the light board. Such setting enables the cutting to be carried out in a symmetrical manner by taking a location of each of the gate driving unit 301 as a symmetry axis to meet the splicing requirements of LED light boards of different sizes.

Furthermore, in the light board obtained by symmetrical cutting, since each of the gate driving units 301 has the same distance from the LED chips 20 at its opposite sides in the same column there as, the problem of waste caused by asymmetrically cutting the light board can be avoided. In addition, the above arrangement can ensure the uniformity of the current on the LED chips 20 on opposite sides of each of the gate driving units 301 on the light board after cutting, which is beneficial to improve the brightness uniformity of the LED light boards after splicing.

Specifically, as shown in FIG. 1, when cutting is performed along a first cutting line 101 or a second cutting line 102, light boards of different sizes with the gate driving unit 301 as the axis of symmetry can be obtained. Therefore, according to the size required by the light board, light boards of different sizes and better current uniformity can be obtained by selecting different cutting lines, and then after splicing the light boards cut from the LED light board 100, the uniformity of the overall brightness of the light board is improved after splicing.

In some embodiments, the numbers of LED chips 20 on opposite sides of each of the gate driving units 301 may also be different, which will not be repeated herein for brevity.

In addition, in a second structure of the LED light board 100 provided by the first embodiment of the present application, as shown in FIG. 2, a difference between the second structure and the first structure is that the plurality of LED chips 20 include plurality of first LED chips 201 and plurality of second LED chips 202 arranged in parallel. The first LED chips 201 are arranged on one side of the gate driving module 30. The second LED chips 202 are arranged on the opposite side of the gate driving module 30. The plurality of gate driving units 301 includes first gate driving units 3011 and second gate driving units 3012 arranged in parallel, the first gate driving units 3011 are arranged at a side of the gate driving module 30 close to the first LED chips 201, and the second gate driving units 3012 are arranged on a side of the gate driving module 30 close to the second LED chips 202. Each of the first gate driving units 3011 is electrically connected to the first LED chips 201 arranged in a same column as corresponding one of first gate driving units 3011, and each of the second gate driving units 3012 is electrically connected to the second LED chips 202 arranged in a same column as corresponding one of the second gate driving units 3012.

In the above arrangement, the first gate driving unit 3011 and the second gate driving unit 3012 are provided, wherein the first gate driving units 3011 provide gate driving signals to the first LED chips 201 located on one side of the gate driving module 30, and the second gate driving units 3012 provide gate driving signals to the second LED chips 202 on an opposite side of the gate driving module 30, such that when cutting the LED light board 100, different sizes of light boards can be cut out, so as to meet the requirements of different sizes of LED lights. Splicing requirements of the board.

Further, the first gate driving unit 3011 and the second gate driving unit 3012 are arranged adjacent to each other, and the numbers of the first LED chips 201 and the second LED chips 202 are the same.

It is understandable that in the cutting process of the LED light board, an edge of the LED light board is usually taken as a starting point for cutting, and the cutting is carried out toward a center of the LED light board according to the size required by the light board. Such setting enables the cutting to be carried out in a symmetrical manner by taking a location of each of the gate driving module 30 as a symmetry axis to meet the splicing requirements of LED light boards of different sizes. Furthermore, the problem of waste caused by asymmetrically cutting the light board can be avoided.

In some embodiments, the first gate driving unit 3011 and the second gate driving unit 3012 may also be arranged on the edge of the LED light board 100, and the positions of the first gate driving unit 3011 and the second gate driving unit 3012 may be selected according to the actual situation, which are not particularly limited in the present application.

Figure 3:
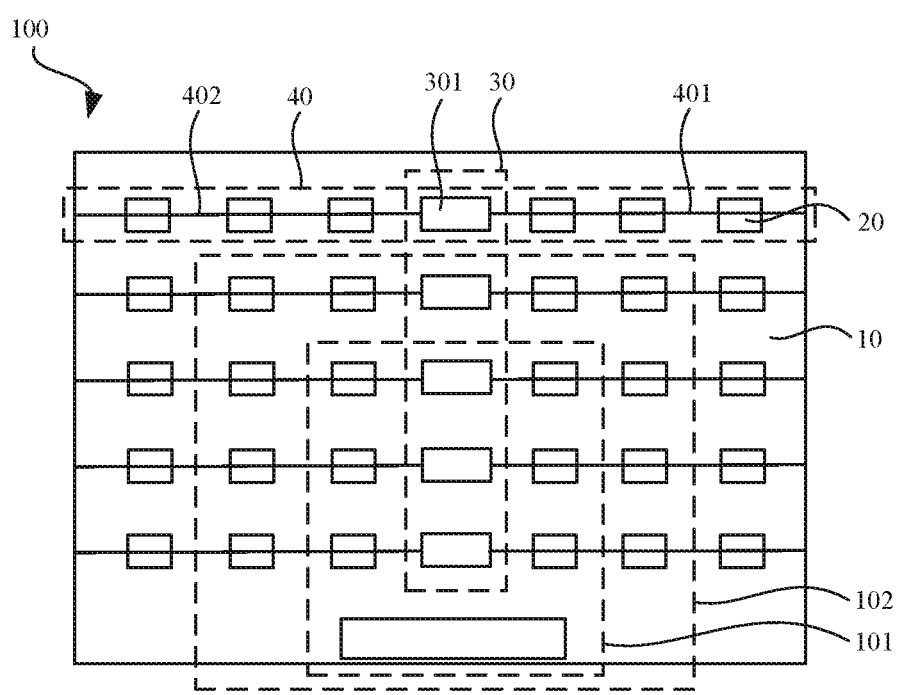
FIG. 3 is a first structural schematic diagram of a LED light board provided by the second embodiment of the present application.
Figure 4:
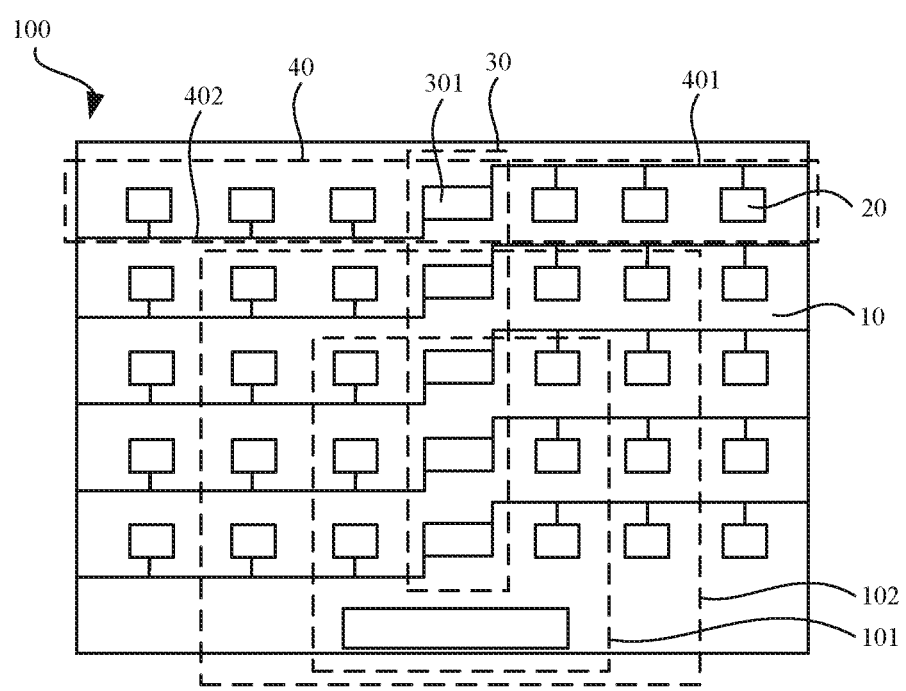
FIG. 4 is a second structural schematic diagram of the LED light board provided by the second embodiment of the present application.

Referring to FIG. 3 and FIG. 4, FIG. 3 is a first structural diagram of the LED light board provided by the second embodiment of the present application; FIG. 4 is a second structural diagram of the LED light board provided by the second embodiment of the present application.

Based on the structure of the first embodiment, the LED light board 100 in the second embodiment of the present application further includes a plurality of first signal wires 401 and a plurality of second signal wires 402. The first signal wires 401 and the second signal wires 402 are arranged at a same level as each other and at a same level as some of layers of the gate driving units 301, wherein in each column, one of the gate driving units 301, the LED chips 20, and one of the first signal wires 401 and one of the second signal wires 402 connecting the gate driving unit 301 to the LED chips 20 form one of display modules 40. In each of the display modules 40, each of the gate driving units 301 is connected to the LED chips 20 located on one side thereof through one of the first signal wires 401, and each of the gate driving units 301 is connected to the LED chips 20 located on an opposite side thereof through one of the second signal wires 402.

Specifically, in the second embodiment of the present application, the first signal wires 401 and the second signal wires 402 may be provided at a same level as the metal layer in the gate driving unit 301, and the metal layer may be a gate metal layer a source metal layer, a drain metal layer, or the like, and the specific metal layer can be selected according to actual situations, which is not particularly limited in the present application.

It should be noted that the second embodiment of the present application only takes the case that the number of LED chips 20 on one side of the gate driving module 30 is the same as the number of LED chips 20 on an opposite side of the gate driving module 30 as an example for description, but is not particularly limited thereto.

In addition, in the second embodiment of the present application, the first signal wires 401 and the second signal wires 402 may all be high-level signal wires, low-level signal wires, or other signal wires. The types of the first signal wires 401 and the second signal wires 402 are not particularly limited herein.

Specifically, in the first structure of the LED light board 100 provided in the second embodiment of the present application, as shown in FIG. 3, in each of the display modules 40, extending directions of each of the first signal wires 401 and each of the second signal wires 402 coincide with each other.

While meeting the splicing requirements of LED light boards of different sizes, the above arrangement simplifies the circuit design by making the extending directions of the first signal wires 401 and the second signal wires 402 coincide with each other, avoids voltage drop caused by the extension of the wires, and thereby, is beneficial to improve the uniformity of the brightness of the light board.

In addition, in the second structure of the LED light board 100 provided by the second embodiment of the present application, as shown in FIG. 4, a difference between the second structure and the first structure is that in each of the display modules 40, the first signal wires 401 and the second signal wires 402 are arranged staggered with each other.

Specifically, in a column direction of the LED chips 20, the first signal wires 401 and the second signal wires 402 are all arranged outside the LED chips 20. Among them, the first signal wires 401 and the second signal wires 402 are symmetrical to each other and arranged on different sides.

It is understandable that for the spliced LED light board, first, the LED light boards are cut out according to the sizes required by the light boards, and then the light boards cut out from different LED light boards are spliced to obtain a spliced LED light board structure. In the prior art, when the light boards cut out from different LED light boards are spliced, signal crosstalk and short-circuiting are prone to occur between the corresponding wires at the splicing positions of the LED light boards to be spliced, thereby greatly impacting the luminous brightness at the splicing position. Therefore, in the prior art, an insulator is usually filled between the spliced LED light boards to prevent the occurrence of short circuit. However, because the insulator has a certain thickness, and there are operational tolerances in the filling process, there is a certain gap between the spliced LED light boards, so that the spliced LED light boards form dark veins at the splicing positions, which seriously impacts the optical taste of the LED light board at the splicing positions.

According to the above arrangement, by arranging the first signal wires 401 and the second signal wires 402 symmetrically and on different sides, on the one hand, the splicing requirements of LED light boards of different sizes are satisfied, and on the other hand, since the first signal wires 401 and the second signal wires 402 are arranged on opposite sides of the LED chips 20, and when the light boards cut out from the LED light board 100 is spliced, the corresponding wires at the splicing positions are staggered with each other, the risk of crosstalk between signal wires is effectively reduced. In addition, the above arrangement can also eliminate the filling of the insulator, which not only avoids the occurrence of dark veins at the splicing positions, but also simplifies the process, thus beneficial to saving process costs.

Referring to FIG. 5 to FIG. 8, an embodiment of the present application also provides a spliced LED light board 200, which includes at least two LED light boards 201 spliced and arranged side by side. The LED light board 201 includes a substrate 20, a plurality of LED chips 30, a gate driving module 40, a plurality of first signal wires 501, and a plurality of second signal wires 502. The LED chips 30 are arranged in an array on the substrate 20. The gate driving module 40 is disposed on the substrate 20 and configured to provide a gate driving signal to the LED chips 30. The gate driving module 40 includes a plurality of gate driving units 401. The LED chips 30 are arranged on opposite sides of the gate driving module 30, and each of the gate driving units 401 is electrically connected to its correspondingly ones of the LED chips 30 on opposite sides of the gate driving units 401. The first signal wires 501 and the second signal wires 502 are arranged at a same level as each other, and are arranged at a same level as some of layers of the gate driving units 401. The gate driving unit 401, the LED chips 30, and the first signal wires 501 and the second signal wires 502 connected to each row form a display module 50. In each column, one of the gate driving units 401, the LED chips 30, and one of the first signal wires 501 and one of the second signal wires 502 connecting the gate driving unit 401 to the LED chips 30 form one of display modules 50. In each of the display modules 50, each of the gate driving units 401 is connected to the LED chips 30 located on one side thereof through one of the first signal wires 501, and each of the gate driving units 401 is connected to the LED chips 30 located on an opposite side thereof through one of the second signal wires 502. In each of the display modules 50, the first signal wires 501 and the second signal wires 502 are arranged staggered with each other, wherein ends of the first signal wires 501 and ends of the second signal wires 502 are staggered with each other.

Therefore, in the spliced LED light board 200 provided by the embodiment of the present application, the ends of the first signal wires 501 and the ends of the second signal wires 502 are staggered with each other in the LED light board 201, so that when different LED light boards 201 are spliced, it can effectively avoid the signal crosstalk between the first signal wires 501 and the second signal wires 502 at the splicing position, thereby reducing a risk of short-circuit between the first signal wires 501 and the second signal wires 502, thus improving the luminous performance of spliced LED light boards.

It is understandable that in the prior art, when different LED light boards are spliced, signal crosstalk and short-circuiting are prone to occur between the corresponding wires at the splicing positions of the LED light boards to be spliced, thereby reducing luminous performance of the LED light board. Therefore, in the prior art, an insulator is usually filled between the spliced LED light boards to prevent the occurrence of short circuit. However, because the insulator has a certain thickness, and there are operational tolerances in the filling process, there is a certain gap between the spliced LED light boards, so that the spliced LED light boards form dark veins at the splicing positions, which seriously impacts the optical taste of the LED light board at the splicing positions.

In this embodiment, the ends of the first signal wires 501 and the ends of the second signal wires 502 in the LED light board 201 are staggered with each other, effectively avoiding the signal crosstalk between the first signal wires 501 and the second signal wires 502 at the splicing position, thereby reducing a risk of short-circuit between the first signal wires 501 and the second signal wires 502, thus improving the luminous performance of spliced LED light boards.

Further, in this embodiment, the first signal wires 501 and the second signal wires 502 are staggered with each other in the LED light board 201, which can also directly eliminate the use of insulator when the LED light board is spliced, and avoid the splicing position. As such, not only the occurrence of dark veins at the splicing positions can be avoided, but also the process is simplified, thus beneficial to saving process costs.

It should be noted that the embodiment of the present application only takes the case that the number of LED chips 30 on one side of the gate driving module 40 is the same as the number of LED chips 30 on an opposite side of the gate driving module 40 as an example for description, but is not particularly limited thereto.

Figure 5:
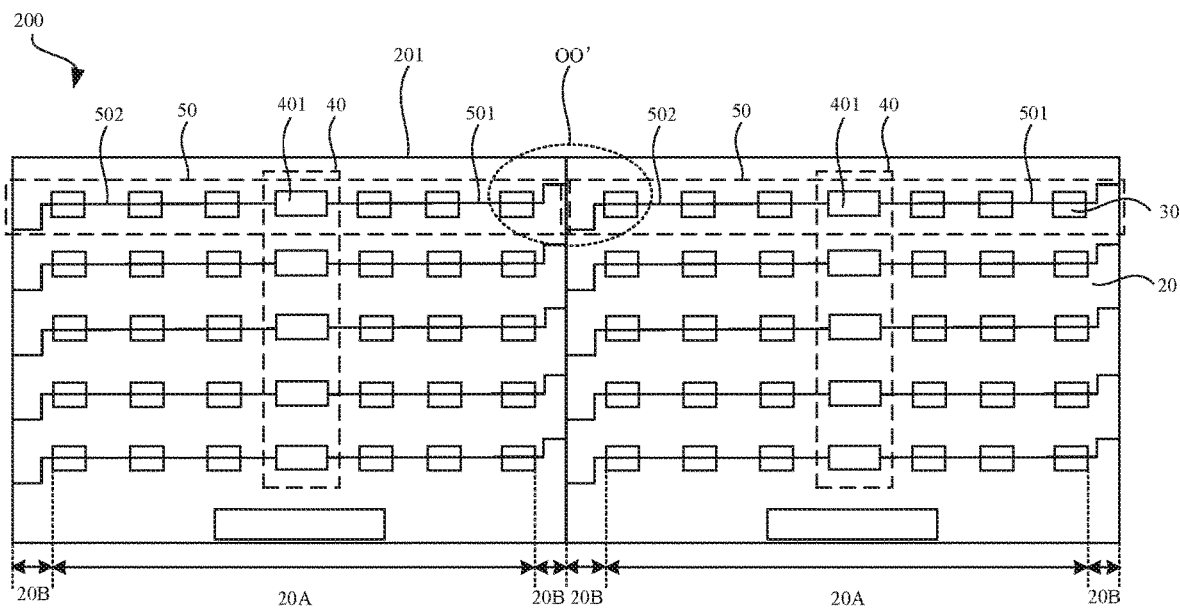
FIG. 5 is a first structural schematic diagram of a spliced LED light board provided by an embodiment of the present application.
Figure 6:
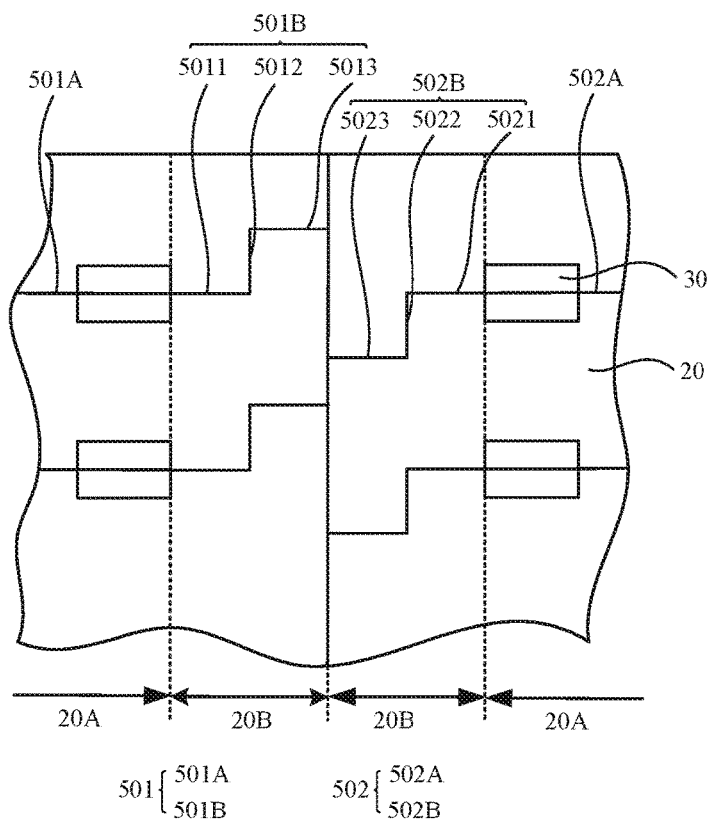
FIG. 6 is a schematic diagram of an enlarged structure of the region OO' in FIG. 5.

Specifically, in the first structure of the spliced LED light board provided by the embodiment of the present application, as shown in FIG. 5 and FIG. 6, the LED light board 201 includes a display area 20A and border areas 20B arranged on opposite sides of the display area 20A. A plurality of LED chips 30 are arranged in the display area 20A. The first signal wires 501 includes a first part 501A and a second part 501B connected to the first part 501A. The first part 501A is located in the display area 20A. The second part 501B is located in the border area 20B. In each of the display modules 50, an orthographic projection of the first part 501A on a plane where the substrate 20 is located penetrates an orthographic projection of the LED chips 30 on the plane where the substrate 20 is located. The second part 501B includes a first horizontal section 5011, a vertical section 5012, and a second horizontal section 5013 that are sequentially connected, the first horizontal section 5011 is connected to the first part 501A, and in a row direction of the LED chips 30, the second horizontal section 5013 is located outside the LED chips 30.

In the first structure of this embodiment, the second signal wire 502 includes a third part 502A and a fourth part 502B connected to the third part 502A. The third part 502A is located in the display area 20A. The fourth part 502B is located in the border area 20B. In each of the display modules 50, an orthographic projection of the third part 502A on a plane where the substrate 20 is located penetrates an orthographic projection of the LED chips 30 on the plane where the substrate 20 is located. The fourth part 502B includes a third horizontal section 5021, another vertical section 5022, and a fourth horizontal section 5023 that are sequentially connected. The third horizontal section 5021 is connected to the third part 502A and in a row direction of the LED chips 30, the fourth horizontal section 5023 is located outside the LED chips 30.

In the above arrangement, the part of the first signal wires 501 located in the border area 20B and the part of the second signal wires 502 located in the border area 20B are staggered with each other, so that when the different LED light boards 201 are spliced, the part of the first signal wires 501 at the splicing position in an LED light board 201 and the part of the second signal wires 502 at the splicing position in another LED light board 201 are arranged staggered with each other, effectively avoiding the signal crosstalk between the first signal wires 501 and the second signal wires 502 at the splicing position, thereby reducing a risk of short-circuit between the first signal wires 501 and the second signal wires 502. In addition, the above arrangement can also simplify the process by staggering the part of the first signal wires 501 and the part of the second signal wires 502 only in the border area 20B, which is beneficial to saving process cost.

In some embodiments, the orthographic projection of the second signal wires 502 on a plane where the substrate 20 is located penetrates the orthographic projection of the LED chips 30 on the plane where the substrate 20 is located, that is, only the part of the first signal wire 501 located in the border area 20B is subjected to a structural design. Such arrangement can still make the first signal wires 501 and the second signal wires 502 staggered with each other when splicing different LED light boards, thereby avoiding the short circuit problem, which will not be repeated herein for brevity.

Figure 7:
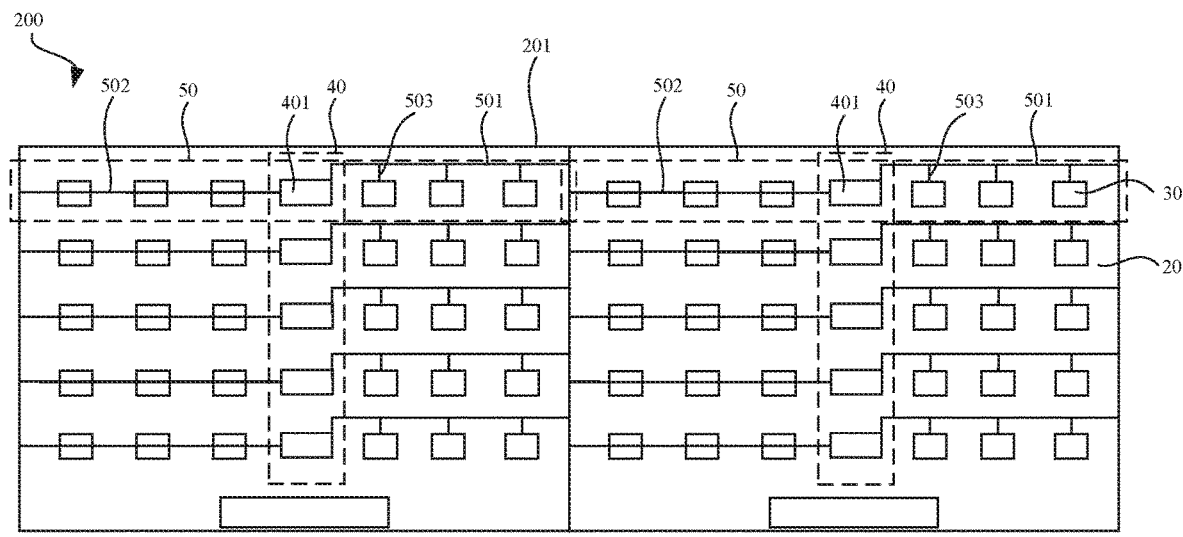
FIG. 7 is a second structural schematic diagram of a spliced LED light board provided by an embodiment of the present application.

In the second structure of the spliced LED light board provided by the embodiment of the present application, as shown in FIG. 7. The difference between the second structure and the first structure is that in the column direction of the LED chips 30, the first signal wires 501 are arranged outside the LED chips 30. The LED light board 201 also includes a plurality of first connection wires 503. The first connection wires 503 are electrically connected to the LED chips 30 in a one-to-one correspondence. The first signal wires 501 is electrically connected to the LED chips 30 through the first connection wires 503. The first connection wires 503 and the first signal wires 501 are arranged in different layers. The orthographic projection of the second signal wires 502 on the plane where the substrate 20 is located penetrates the orthographic projection of the LED chips 30 on the plane where the substrate 20 is located.

In the above arrangement, the first signal wires 501 are arranged on the outside of the LED chips 30, so that the portion of the first signal wires 501 located in the border area 20B directly extends in the horizontal direction to the splicing position, avoiding the need for bending design of the first signal wires 501 which occupies the space of the border area 20B, thereby saving the space of the border area 20B, and being beneficial to realize the narrow bezel design of the LED light board 201. Further, this arrangement shortens the distance between the LED chips 30 adjacent to the border area 20B and the different LED light boards 201, thereby improving the luminous brightness at the splicing position and reducing the bezel of the splicing LED light board 200 The difference in the brightness between the border area 20B and the display area 20A, thereby greatly improving the uniformity of the overall brightness of the spliced LED light board.

In addition, in the second structure of the embodiment of the present application, by arranging the first connection wires 503 and the first signal wires 501 in different layers, the space between adjacent ones of the LED chips is saved, and thereby when the first signal wires 501 are designed for wiring, a line width of each of the first signal wires 501 can be appropriately increased, which is beneficial to reduce the voltage drop on the first signal wires 501, thereby further improving the uniformity of the overall brightness of the spliced LED light board.

Figure 8:
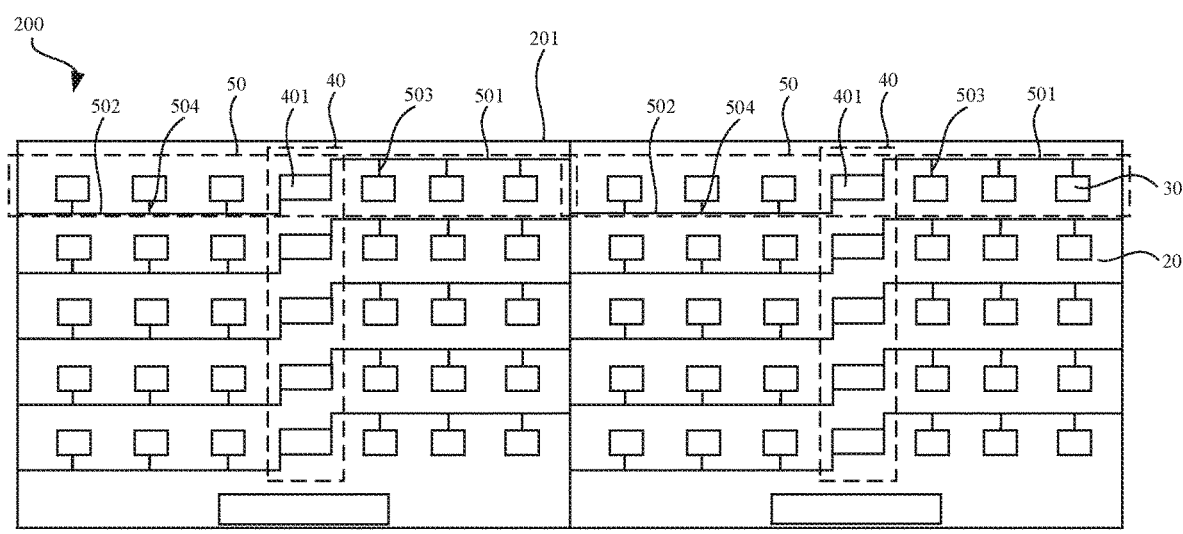
FIG. 8 is a third structural schematic diagram of a spliced LED light board provided by an embodiment of the present application.

In the third structure of the spliced LED light board provided by an embodiment of the present application, as shown in FIG. 8, the difference between the third structure and the second structure is that in the column direction of the LED chips 30, the second signal wires 502 are located outside the LED chips 30 and arranged on a different side from the first signal wires 501. The LED light board also includes a plurality of second connection wires 504. The second connection wires 504 are electrically connected to the LED chips 30 in a one-to-one correspondence. The second signal wires 502 are electrically connected to the LED chip 30 through the second connection wires 504.

Specifically, in the third structure of this embodiment, in the column direction of the LED chips 30, the line width of each of the first signal wires 501 and the line width of each of the second signal wires 502 are both smaller than one half of the distance between adjacent ones of the LED chips 30.

It can be understood that when different LED light boards 201 are spliced in alignment, the corresponding signal wires at the splicing position may shift during alignment. The above arrangement makes the first signal wires 501 and the second signal wires 502 corresponding to the splicing position have a certain offset distance during alignment, thereby facilitating reduction in difficulty of splicing alignment and assembly of different LED light boards 201.

Further, in the third structure of the embodiment of the present application, the second connection wires 504 and the second signal wires 502 are arranged in different layers, such that when the second signal wires 502 are designed for wiring, under the premise of ensuring that the first signal wires 501 and the second signal wires 502 are staggered with each other, the line width of the second signal wires 502 can be appropriately increased, which is beneficial to reduce the voltage drop on the second signal wires 502, thereby improving the uniformity of the overall brightness of the spliced LED light board.

It should be noted that the substrate 20 in the embodiment of the present application includes gate scan lines, data lines, thin-film transistors, and various insulating layers (not shown). The specific structure of the substrate 20 can refer to the prior art, and it will not be repeated herein for brevity.

In addition, in the actual process, electrical connection between the first signal wires 501 and the plurality of first connection wires 503, and electrical connection between the second signal wires 502 and the plurality of the second connection wires 504 can be realized by providing vias on an insulating layer in the substrate 20. The specific layered structure can be selected according to actual conditions, which is not particularly limited in this application.

Compared with the LED light board in the prior art, the LED light board provided by the present application satisfies requirements of light boards of different sizes by providing a gate driving module on a substrate, wherein the gate driving module includes a plurality of gate driving units, the LED chips are arranged on opposite sides of the gate driving module, and each of the gate driving units is electrically connected to its corresponding ones of the LED chips on opposite sides of the gate driving unit, such that when cutting the LED light board, different sizes of light boards can be cut out, so as to meet the requirements of different sizes of LED lights. Splicing requirements of the board.

Figure 9:
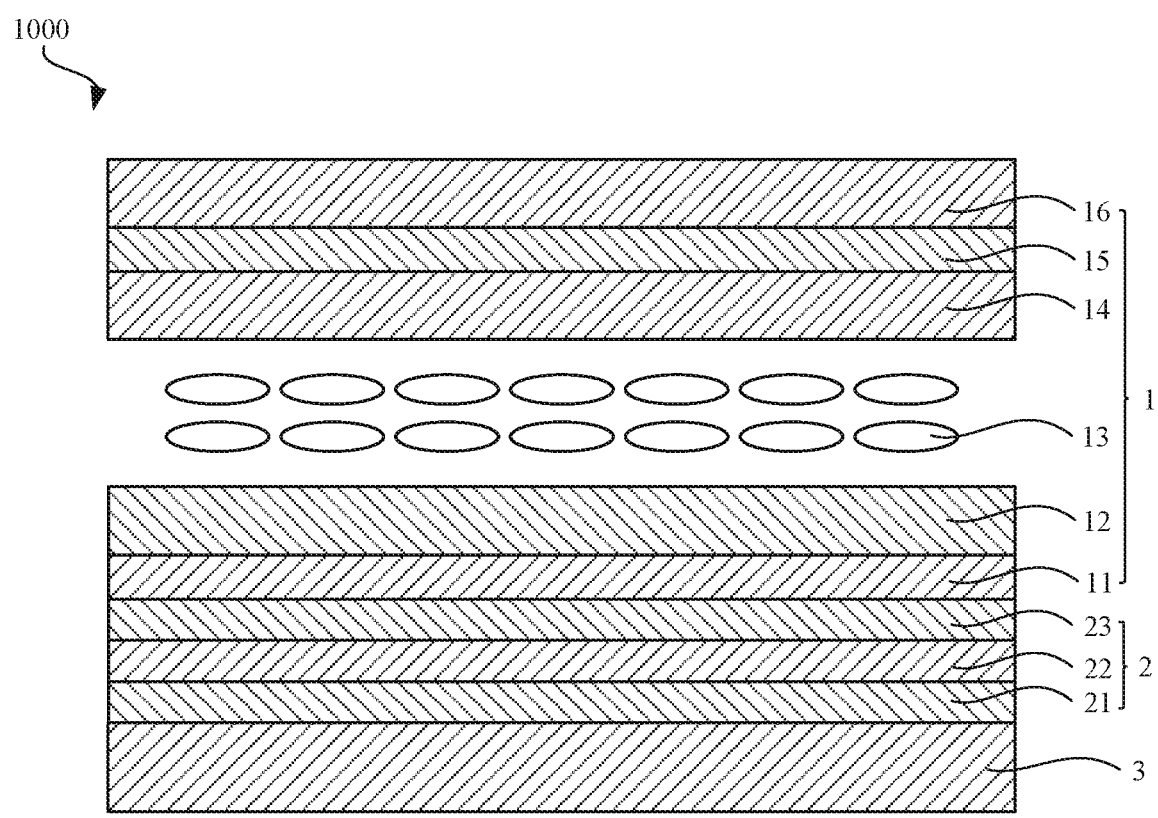
FIG. 9 is a schematic structural diagram of a display device provided by an embodiment of the present application.

Referring to FIG. 9, it is a schematic structural diagram of a display device provided by an embodiment of the application.

An embodiment of the present application also provides a display device 1000. The display device 1000 includes a liquid crystal display panel 1, an optical layer 2, and a backlight module 3 arranged in sequence. The backlight module 3 may include the LED light board 100 or the spliced LED light board 200 described in any of the above embodiments. The specific structure of the LED light board 100 or the spliced LED light board 200 can be referred to the description of the above-mentioned embodiments, which will not be repeated herein for brevity.

The liquid crystal display panel 1 includes a lower polarizer 11, an array substrate 12, a liquid crystal 13, a color filter substrate 14, an upper polarizer 15, and a cover plate 16 which are sequentially arranged on the optical layer 2.

The optical layer 2 includes a fluorescent film 21, a diffusion film 22, and a brightening film 23 which are sequentially arranged on the backlight module 3. In some embodiments, the optical layer 2 may also include other layered structures, and this embodiment cannot be construed as a limitation of the application.

The embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A spliced light-emitting diode (LED) light board, comprising at least two LED light boards spliced and arranged side by side, wherein each of the LED light boards comprises:
    a substrate;
    a plurality of LED chips disposed in an array on the substrate; and
    a gate driving module disposed on the substrate and configured to provide a gate driving signal to the LED chips, wherein the gate driving module comprises a plurality of gate driving units, the LED chips are arranged on opposite sides of the gate driving module, and each of the gate driving units is electrically connected to its correspondingly ones of the LED chips on opposite sides of the gate driving unit; and
    a plurality of first signal wires and a plurality of second signal wires, which are arranged at a same level as each other and at a same level as some of layers of the gate driving units, wherein in each column, one of the gate driving units, the LED chips, and one of the first signal wires and one of the second signal wires connecting the gate driving unit to the LED chips form one of display modules,
    wherein, in each of the display modules, each of the gate driving units is connected to the LED chips located on one side thereof through one of the first signal wires, and each of the gate driving units is connected to the LED chips located on an opposite side thereof through one of the second signal wires; and
    wherein ends of the first signal wires and the ends of the second signal wires are staggered with each other.

2. The spliced LED light board according to claim 1, comprising a display area and border areas arranged at opposite sides of the display area, wherein the plurality of LED chips are arranged in the display area;
    wherein each of the first signal wires comprises a first part and a second part connected to the first part, and the first part is located in the display area, and the second part is located in the border area;
    wherein, in each of the display modules, an orthographic projection of the first part on a plane where the substrate is located penetrates an orthographic projection of the LED chips on the plane where the substrate is located; and wherein, the second part comprises a first horizontal section, a vertical section, and a second horizontal section that are sequentially connected, the first horizontal section is connected to the first part, and in a row direction of the LED chips, the second horizontal section is located outside the LED chips.

3. The spliced LED light board according to claim 1, wherein in a column direction of the LED chips, the first signal wires are arranged outside the LED chips.

4. The spliced LED light board according to claim 3, wherein each of the LED light boards further comprises a plurality of first connection wires, the first connection wires are electrically connected to the LED chips in a one-to-one correspondence, and the first signal wires are electrically connected to the LED chips through the first connection wires; and wherein the first connection wires and the first signal wires are arranged at different levels.

5. The spliced LED light board according to claim 4, wherein, in the column direction of the LED chips, the second signal wires are located outside the LED chips and located at a side different from the first signal wires; and wherein each of the LED light boards further comprises a plurality of second connection wires, the second connection wires are electrically connected to the LED chips in a one-to-one correspondence, and the second signal wires are electrically connected to the LED chips through the second connection wires.

6. The spliced LED light board according to claim 5, wherein in the row direction of the LED chips, a line width of each of the first signal wires and a line width of each of the second signal wires are both smaller than one half of a distance between adjacent ones of the LED chips.

7. The spliced LED lamp panel according to claim 1, wherein the first signal wires and the second signal wires are both high-level signal wires or low-level signal wires.

8. A display device, comprising a liquid crystal display panel and a backlight module, wherein the backlight module comprises a light-emitting diode (LED) light board, and the LED light board comprises:

a substrate;
a plurality of LED chips disposed in an array on the substrate;
a gate driving module disposed on the substrate and configured to provide a gate driving signal to the LED chips, wherein the gate driving module comprises a plurality of gate driving units, the LED chips are arranged on opposite sides of the gate driving module, and each of the gate driving units is electrically connected to its corresponding ones of the LED chips on opposite sides of the gate driving unit; and
a plurality of first signal wires and a plurality of second signal wires, which are arranged at a same level as each other and at a same level as some of layers of the gate driving units, wherein in each column, one of the gate driving units, the LED chips, and one of the first signal wires and one of the second signal wires connecting the gate driving unit to the LED chips form one of display modules;

wherein, in each of the display modules, each of the gate driving units is connected to the LED chips located on one side thereof through one of the first signal wires, and each of the gate driving units is connected to the LED chips located on an opposite side thereof through one of the second signal wires; and wherein ends of the first signal wires and the ends of the second signal wires are staggered with each other.

9. The display device according to claim 8, wherein the plurality of gate driving units and the plurality of LED chips are arranged in an array;

the plurality of gate driving units are arranged in a column; and
each of the gate driving units is electrically connected to the LED chips arranged on opposite sides of the gate driving unit which are in a same row as corresponding one of the gate driving units.

10. The display device according to claim 9, wherein a number of the LED chips arranged on and electrically connected to one side of each of the gate driving units is same as a number of the LED chips arranged on and electrically connected to an opposite side of each of the gate driving units.

* * * * *